United States Patent [19]
Cho et al.

[11] Patent Number: 5,296,824
[45] Date of Patent: Mar. 22, 1994

[54] LOW LOSS WIDE BANDWIDTH PARALLEL CHANNEL ACOUSTIC FILTER

[75] Inventors: Frederick Y. Cho, Scottsdale; Thomas S. Hickernell, Tempe; David Penunuri, Fountain Hills, all of Ariz.

[73] Assignee: Motorola, Inc., Schaumburg, Ill.

[21] Appl. No.: 801,297

[22] Filed: Dec. 2, 1991

[51] Int. Cl.$^5$ ............................................. H03H 9/64
[52] U.S. Cl. ................................... 333/193; 333/195; 310/313 R; 310/313 B; 310/313 D
[58] Field of Search .................... 333/193, 195, 133; 310/313 R, 313 B, 313 C, 313 D

[56] References Cited

U.S. PATENT DOCUMENTS

| | | | |
|---|---|---|---|
| 3,855,556 | 12/1974 | Hartmann | 333/193 |
| 3,942,140 | 3/1976 | Laker et al. | 333/193 |
| 4,028,649 | 6/1977 | Komatsu et al. | 333/194 |
| 4,247,836 | 1/1981 | Redwood et al. | 333/195 |
| 4,609,891 | 9/1986 | Solie et al. | 333/195 |
| 4,731,595 | 3/1988 | Wright | 333/195 |
| 4,939,487 | 7/1990 | Yuhara et al. | 333/193 |
| 5,010,269 | 4/1991 | Hikita et al. | 333/195 X |
| 5,093,638 | 3/1992 | Kinsman et al. | 333/195 |
| 5,136,266 | 8/1972 | Niitsuma | 310/313 C X |

FOREIGN PATENT DOCUMENTS

| | | | |
|---|---|---|---|
| 20021 | 2/1983 | Japan | 333/195 |
| 214314 | 12/1984 | Japan | 333/195 |
| 196007 | 10/1985 | Japan | 333/195 |
| 65615 | 4/1986 | Japan | 333/193 |
| 43204 | 2/1987 | Japan | 333/193 |
| 201816 | 9/1991 | Japan | 333/193 |

OTHER PUBLICATIONS

Colvin, et al; "Stagger Tuning of SAW Filters for Blood Bandwidth and Good Shape Factor", *IEEE Trans Sonic and Ultrasonics*; vol. SU29, No. 1; Jan. 1982; pp. 50–52.

An article entitled "Low loss, Highly Stable SAW Devices on Quartz", T. N. Oliver et al., 40th Annual Frequency Control Symposium, pp. 269–274.

*Primary Examiner*—Benny Lee
*Attorney, Agent, or Firm*—Frederick M. Fliegel

[57] ABSTRACT

An acoustic wave filtering apparatus includes an acoustic wave propagating substrate for supporting propagation of acoustic waves and a plurality of acoustic wave filters for filtering an electrical signal. Each of said plurality further comprises an input for supplying electrical input signals, an input unidirectional acoustic wave transducer for converting electrical signal energy into acoustic energy, an output unidirectional acoustic wave transducer for converting acoustic signals to electrical signals, and an output for combining and delivering electrical output signals to external electrical apparatus.

27 Claims, 6 Drawing Sheets

LOW LOSS WIDE BANDWIDTH PARALLEL CHANNEL ACOUSTIC FILTER

CROSS-REFERENCE TO RELATED APPLICATIONS

The present application is related to co-pending U.S. patent applications Ser. Nos. 754,477, now U.S. Pat. No. 5,212,420, and 733,933, which are assigned to the same assignee as the present invention.

FIELD OF THE INVENTION

The present invention pertains to frequency selection components and more particularly to wide bandwidth, low insertion loss surface acoustic wave filters.

BACKGROUND OF THE INVENTION

Acoustic wave filters comprise a class of frequency selection components having the advantages of small size, light weight, and large out-of-band signal rejection.

Periodic or quasi-periodic acoustic wave transducer structures are employed for achieving acousto-electric and electro-acoustic energy conversion required in surface acoustic wave filters. The bandwidth of an acoustic wave transducer (and filter) is inversely proportional to the length of the acoustic wave transducer.

A first problem which all acoustic wave filters incur is that such structures typically provide efficient energy conversion, but also impose bandwidth limitations on the frequency response of the completed acoustic wave filter.

A second problem which many acoustic wave transducers suffer is "ripple" or nonuniformity of the pass-band frequency response of the completed filter due to what is termed "triple-transit" distortion of the filter response. Triple transit distortion results from acoustic reflections within an acoustic wave filter, which occur when a propagating acoustic wave impinges upon, for example, a simple, bi-directional acoustic wave transducer. Such transducers are often preferred because they are easily manufactured using a single photolithography step, by techniques which are very similar to those employed to fabricate semiconductor-based integrated circuit devices, as is well known in the art.

The triple transit distortion level can be minimized by increasing the pass-band insertion loss of the acoustic wave filter, without increasing the filter's fabrication complexity.

However, this approach requires large filter insertion losses in order to satisfy many system specifications for filter pass-band insertion loss uniformity. These losses are often deliberately introduced into acoustic wave filters in order to ameliorate triple-transit induced effects. In turn, these large filter insertion losses necessitate either pre- or post-filter gain, effected via amplifiers. Such amplifiers require power, occupy space, and impose weight requirements which are inconsistent with many applications for low-power, hand-portable communications equipment, wherein acoustic wave filters find substantial application.

What is needed are means and methods for achieving wide bandwidth acoustic wave filters. What is further needed are means and methods for providing wide bandwidth acoustic wave filters also having low pass-band insertion loss, low triple transit spurious response, strong rejection of out-of-band signals, and single level photolithographic process fabrication requirements.

SUMMARY OF THE INVENTION

In accordance with the present invention, a novel method and apparatus for providing low pass-band insertion loss acoustic wave filters having simplified fabrication requirements is described.

An acoustic wave filtering apparatus includes an acoustic wave propagating substrate for supporting propagation of acoustic waves and a plurality of acoustic wave filters for filtering an electrical signal. Each of the plurality further comprises an input for supplying electrical input signals, an input unidirectional acoustic wave transducer for converting electrical signal energy into acoustic energy, an output unidirectional acoustic wave transducer for converting acoustic signals to electrical signals, and an output for combining and delivering electrical output signals to external electrical apparatus.

The method for providing low insertion loss acoustic filters comprises the steps of (1) providing an acoustic wave propagating substrate, (2) coupling a plurality of acoustic wave filters to the acoustic wave propagating substrate, (3) supplying an input signal to the first and second acoustic wave filters; and (4) combining the output signals from the first and second acoustic wave filters in parallel.

DETAILED DESCRIPTION OF THE PREFERRED EMBODIMENTS

A broad variety of different acoustic wave types have application in microwave acoustic devices for frequency selection. These include surface acoustic waves (SAWs), also known as Rayleigh waves; surface skimming bulk acoustic waves (SSBAWs); shallow bulk acoustic waves (SBAWs); surface transverse waves (STWs); Stonely, Sezawa, Love, and other plate and higher order acoustic guided waves; longitudinal and shear bulk acoustic waves (BAWs); line acoustic waves (LAWs); and so on. For convenience of explanation, the present invention is described in terms of SAWs, with the understanding that other varieties of acoustic propagation are also applicable, including but not limited to those listed above.

The terms "surface acoustic wave", "acoustic wave", and "surface wave" or "SAW", are employed interchangeably herein to stand for any suitable type of acoustic wave propagation. The terms "substrate material", "substrate", and "acoustic wave propagating substrate" are employed interchangeably herein to stand for any substrate that supports propagation of acoustic waves. The terms "reflection element" and "reflection electrode" are employed interchangeably herein to stand for reflection elements comprising electrodes. Further, the terms "comb electrode" and "transducer electrode" are employed interchangeably herein to stand for acoustic wave transducer elements comprising electrodes.

Figure 1:
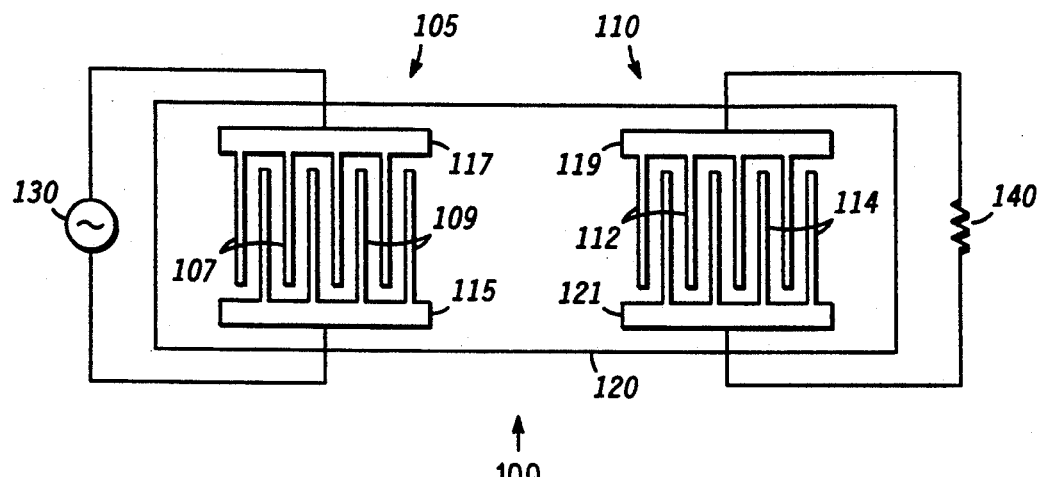
FIG. 1 is a plan view of an acoustic wave filter in accordance with the prior art.

FIG. 1 is a plan view of an acoustic wave filter 100. Acoustic wave filter 100 in accordance with the prior art comprises substrate 120 and bi-directional transducers 105 and 110 which are connected to signal source 130 and load 140, respectively. Transducers 105 and 110 further comprise busses 115, 117, 119 and 121 and comb electrodes 107, 109, 112 and 114. Comb electrode 107 comprises electrodes connected to buss 115. Similarly, comb electrodes 109, 112 and 114 comprise electrodes connected to busses 117, 119 and 21, respectively. Transducers 105 and 110 convert electrical to acoustic energy, and vice versa. Interdigitated comb electrodes 107, 109, 112 and 114 are interconnected by busses 115, 117, 119 and 121. Electrodes 107, 109, 112 and 114, and busses 115, 117, 119 and 121 are made of thin-film metal, deposited, for example, by vacuum evaporation, on the polished surface of substrate material 120 which is in whole or in part piezoelectric. Comb electrodes 107, 109, 112 and 114 making up acoustic wave transducers 105 and 110 are typically defined photolithographically, using processes well known in the art.

The piezoelectric nature of substrate material 120 causes mechanical waves to be emitted bi-directional transducer 105 when excited by electrical signals from signal source 130 having an appropriate frequency, and conversely transducer 110 delivers electrical output signals to load 140 when bi-directional transducer 110 is appropriately illuminated by acoustic waves.

The Applicants have discovered that the efficiency and low pass-band insertion loss of narrow-band acoustic filters can provide low pass-band insertion loss and broader bandwidth when a plurality of such filters are combined in parallel with the proper phasing of signals to and from each individual acoustic filter.

Figure 2:
FIG. 2 represents an acoustic wave device in accordance with the present invention.

FIG. 2 represents an acoustic wave device 200 in accordance with the present invention. Acoustic wave device 200 comprises acoustic wave filters 217 and 219 disposed atop substrate 120. Acoustic wave filter 217 comprises acoustic reflector 203, acoustic transducer 205, optional conductive structure 208, and gaps 250 and 25. Acoustic wave filter 217 has a first center frequency. Acoustic wave filter 217 further comprises acoustic transducer 210 and acoustic reflector 213. Acoustic wave filter 219 comprises acoustic reflector 223, acoustic transducer 225, acoustic transducer 230, acoustic reflector 233, input connection 201, output connection 215, and gaps 260 and 265. Acoustic wave filter 219 has a second center frequency.

Acoustic wave reflector 203 and acoustic transducer 205 are adjacent and substantially aligned as shown in FIG. 2, with gap 250 disposed therebetween. Acoustic transducer 210 is adjacent to and substantially aligned with acoustic transducer 205, with optional conductive structure 208 disposed therebetween. Acoustic wave reflector 213 is adjacent to and substantially aligned with acoustic transducer 210, with gap 255 disposed therebetween, as shown in FIG. 2.

Acoustic wave reflector 223 and acoustic transducer 225 are adjacent and substantially aligned as shown in FIG. 2, with gap 260 disposed therebetween. Acoustic transducer 230 is adjacent to and substantially aligned with acoustic transducer 225, with optional conductive structure 208 disposed therebetween. Acoustic wave reflector 233 is adjacent to and substantially aligned with acoustic transducer 230, with gap 265 disposed therebetween, as shown in FIG. 2. One side of each of transducers 205, 210, 225 and 230 is connected to ground, as illustrated in FIG. 2.

In operation, electrical energy is supplied to input 201, causing acoustic transducers 205 and 225 to emit acoustic energy towards acoustic reflectors 203 and 223, respectively, and also towards optional conductive structure 208 (i.e., transducers 205 and 225 by themselves are bi-directional). Acoustic energy of a frequency in the filter incident on acoustic reflector 203 is reflected back towards acoustic transducer 205, with the result that acoustic energy having a frequency in the filter pass-band is largely or wholly emitted from transducer 205 and acoustic reflector 203 towards optional conductive structure 208.

Similarly, acoustic energy having a frequency in the filter pass-band incident on acoustic reflector 223 is reflected back towards acoustic transducer 225, with the result that acoustic energy having a frequency in the filter pass-band is largely or wholly emitted from transducer 225 and acoustic reflector 223 towards optional conductive structure 208. As well, acoustic energy in the filter pass-band incident on acoustic reflector 213 is reflected back towards acoustic transducer 210, with the result that acoustic energy having a frequency in the filter pass-band is largely or wholly emitted from transducer 210 and acoustic reflector 213 towards optional conductive structure 208. Further, acoustic transducer 230 and acoustic reflector 233 cooperate to form a uni-directional acoustic transducer emitting acoustic waves towards optional conductive structure 208. The output 215 is the sum of signals from transducers 210 and 230. The output on lead 215 provides wide bandwidth together with low insertion loss.

The acoustic filters thus formed provide the advantages of low insertion loss and broad bandwidth signal output together with the simplicity and desirability of single-level photolithography requirements.

The Applicants have further discovered that these advantages can be effected together with requirements for only one or two distinct comb electrode and reflection electrode line-widths for the acoustic filters when the distinct pass-band frequencies of the separate filter functions are realized through inclusion of gaps of different sizes in filters containing uni-directional acoustic transducers and acoustic reflectors separated by such gaps. Requirements for multiple linewidths, especially those having non-integer linewidth relationships, cause difficulties in photomask preparation and also in the photolithography required for acoustic wave filter fabrication. The Applicant's invention employs variations in the size of gaps 251 and 261 to effect different center frequencies for transducers having the same linewidths.

Figure 3:
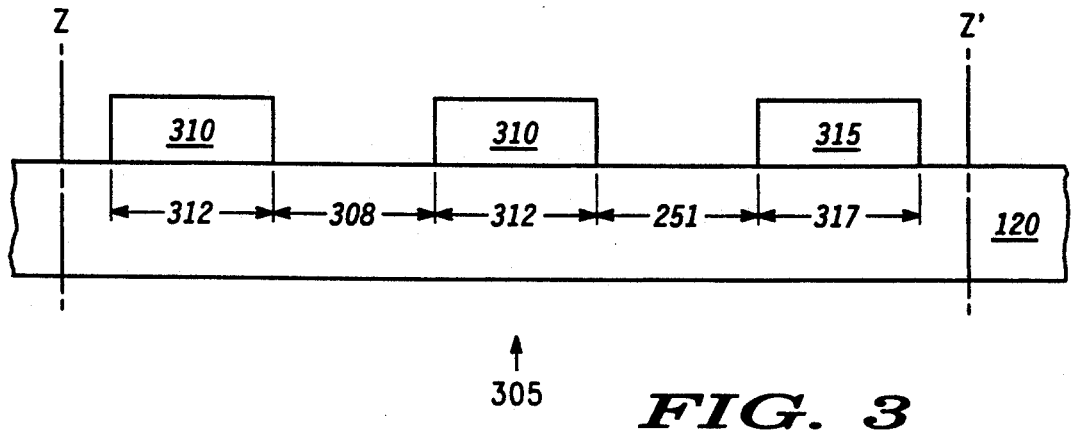
FIG. 3 is an enlarged side view, in section, taken on section lines Z—Z' of FIG. 2, of a portion of an acoustic reflector structure in accordance with a first embodiment of the present invention.

FIG. 3 is an enlarged side view, in section, taken on section lines Z—Z' of FIG. 2, of a portion 305 of an acoustic reflector structure in accordance with a first embodiment of the present invention. FIG. 3 illustrates a portion of substrate 120, acoustic reflector elements 310, acoustic transducer electrode 315 having width 317, and a gap of width 251. Acoustic reflector 203, analogous to acoustic reflectors 213, 223 and/or 233 (FIG. 2), comprises reflection elements 310, each having width 312 of approximately one-fourth of an acoustic wavelength, separated by gaps of width 308 width 308 also being approximately one-fourth of an acoustic wavelength.

Figure 4:
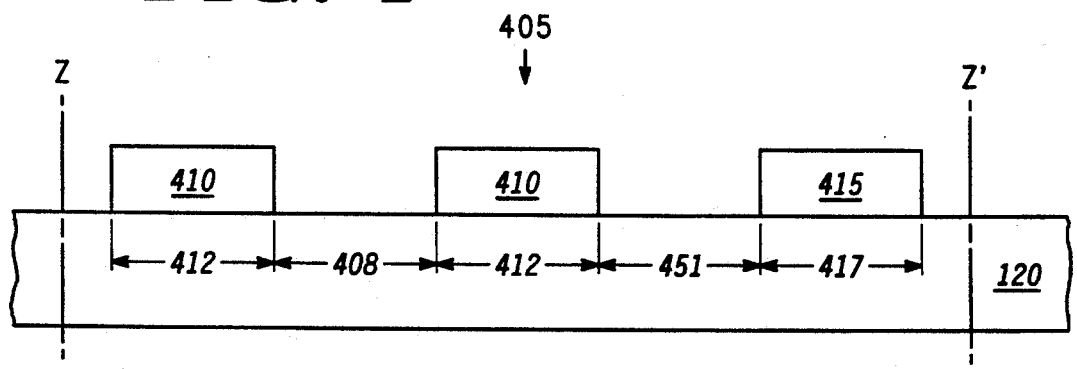
FIG. 4 is an enlarged side view, in section, taken on section lines Z—Z' of FIG. 2, of a portion of an acoustic reflector structure in accordance with a second embodiment of the present invention.

FIG. 4 is an enlarged side view, in section, taken on section lines Z—Z' of FIG. 2, of portion 405 of an acoustic reflector structure in accordance with a second embodiment of the present invention. FIG. 4 illustrates a portion of substrate 120, acoustic reflector elements 410, acoustic transducer electrode 415 and having width 417 a gap of width 415, analogous to gap 250 (FIG. 2) and separating acoustic transducer electrode 415 from acoustic reflector elements 410. Acoustic reflector 203, analogous to acoustic reflectors 213, 223 and/or 233 (FIG. 2), comprises reflection elements 410, each having width 412 of approximately one-half of an acoustic wavelength, separated by gaps of width 408, width 408 being approximately one-half of an acoustic wavelength.

FIGS. 5–8 depict measured responses for a set of acoustic wave filters constructed on a substrate of 128° Y-rotated X-propagating LiNbO$_3$, having a wavelength of 4.158 micrometers, and utilizing the acoustic reflector arrangement depicted in FIG. 4. The electrodes in both the reflectors and the transducers are fabricated from Al having a thickness of 1900 Angstroms. Widths 251 and 261 (FIG. 2; see also width 451, FIG. 4) were about ⅜ and ⅝ wavelengths, corresponding to 1.53 and 2.55 micrometers, respectively. The center frequencies of all the pass-bands illustrated in FIGS. 5–8 are in the range of 930 MegaHertz. Filters in this frequency range are undergoing intense development at the present time.

FIGS. 5–8 depict measured acoustic wave filter responses wherein the vertical scales show measured signal amplitudes on a scale of 5 dB per division, with 0 dB insertion loss corresponding to the top of the graph, and where the horizontal scale represents signal frequency on a scale of 25 MegaHertz per division, with the center of the graph corresponding to a frequency of 930.5 MegaHertz.

Figure 5:
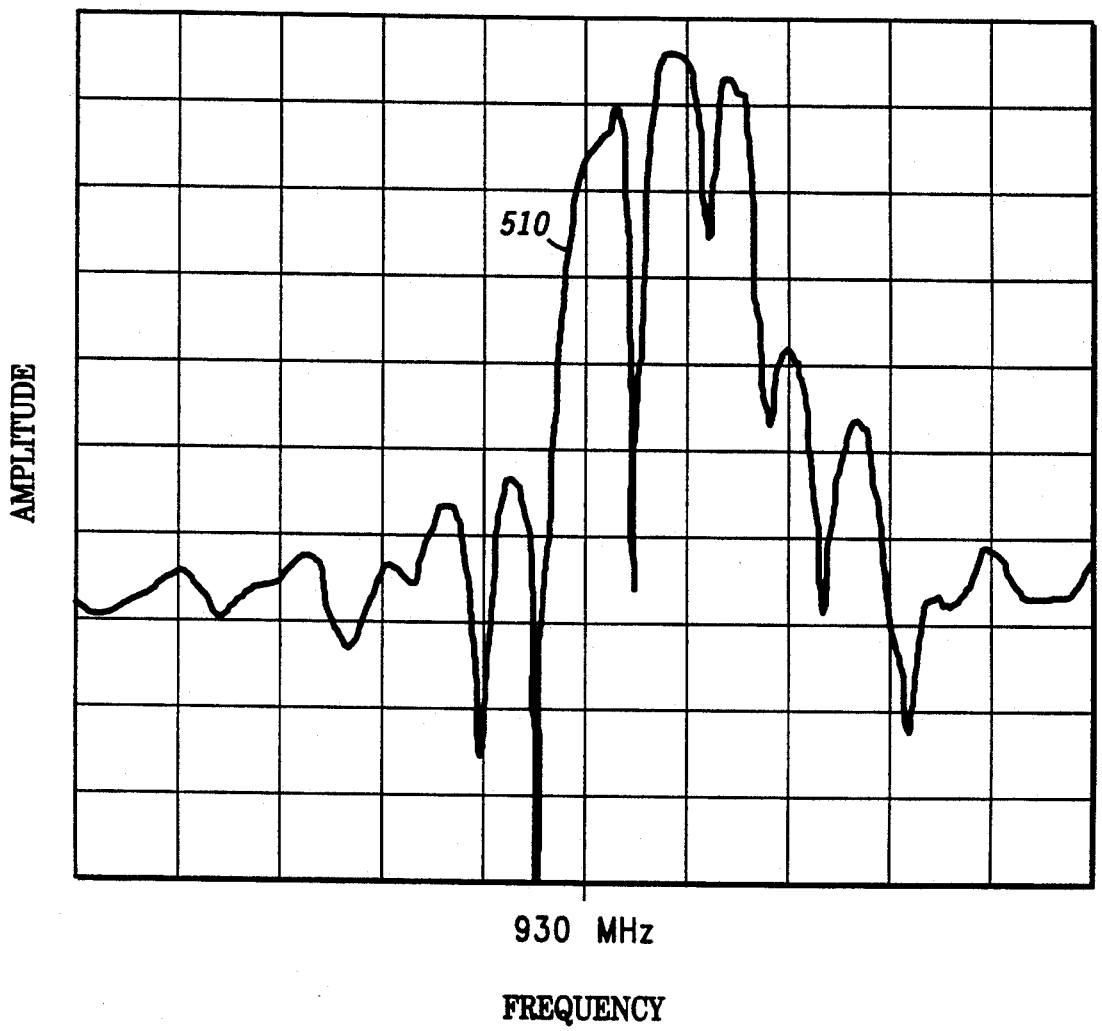
FIG. 5 illustrates a response measured from a first acoustic transducer to a second acoustic transducer of the present invention.

FIG. 5 illustrates the response measured from a first acoustic transducer to a second acoustic transducer versus frequency. Response 510 shows a pass-band response to the right of the middle of the figure, having substantial ripple within the pass-band, a pass-band insertion loss of about 1.4 dB and a 3 dB bandwidth of about 10 MegaHertz. The out-of-band signal rejection characteristics surrounding the pass-band show about 20 to 25 dB of rejection.

Figure 6:
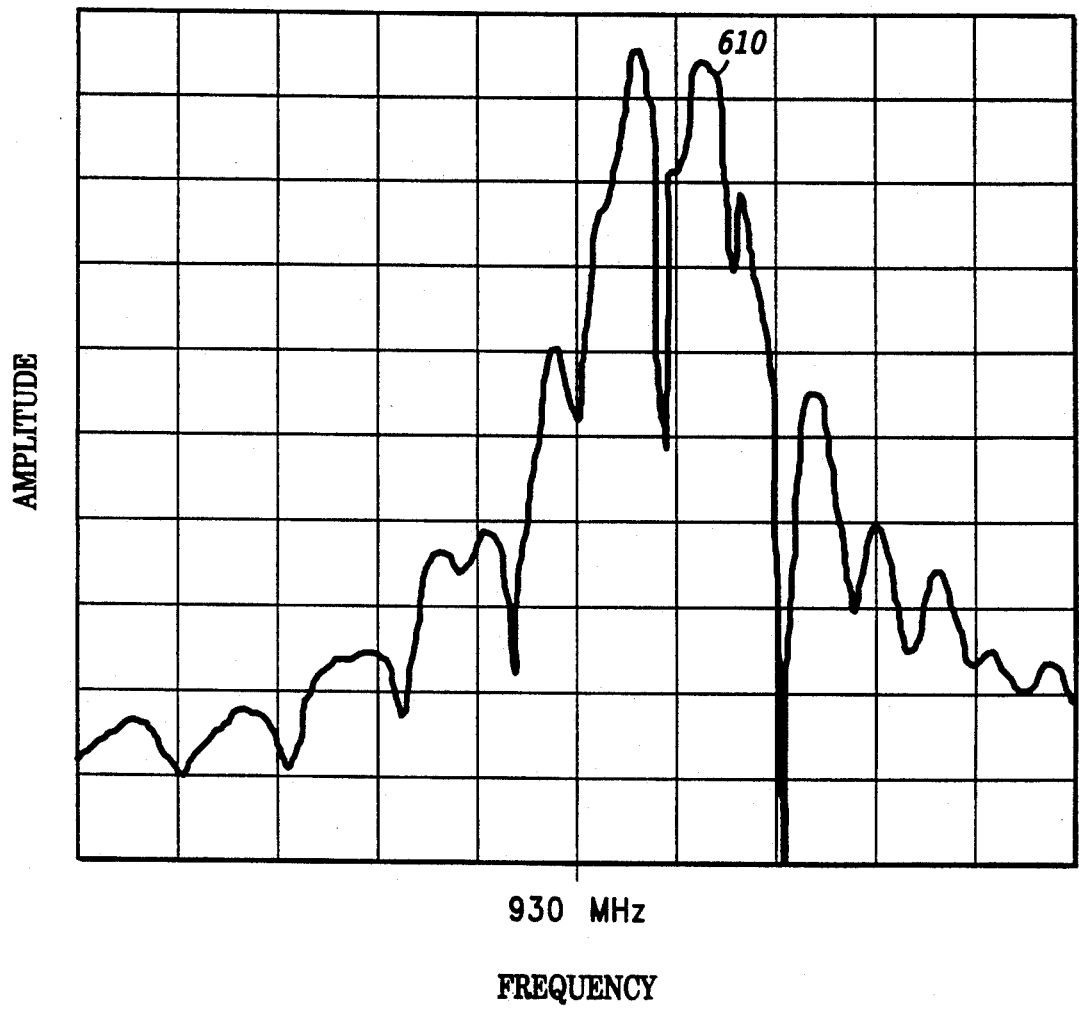
FIG. 6 illustrates a response measured from a third acoustic transducer to a fourth acoustic transducer of the present invention.

FIG. 6 illustrates the response measured from a third acoustic transducer to a fourth acoustic transducer versus frequency. Response 610 shows a pass-band response to the right of the middle of the figure, having substantial ripple within the pass-band, a pass-band insertion loss of about 1.8 dB and a 3 dB bandwidth of about 10 MegaHertz. The out-of-band signal rejection characteristics surrounding the pass-band show about 25 to 30 dB of rejection. The data of FIGS. 5 and 6 differ substantially while the devices from which the data were taken differ only in the width of the gaps 250, 255, 260 and 265. Gaps 250 and 255 are ⅜ of an acoustic wavelength in width while gaps 260 and 265 are ⅝ of an acoustic wavelength in width.

Figure 7:
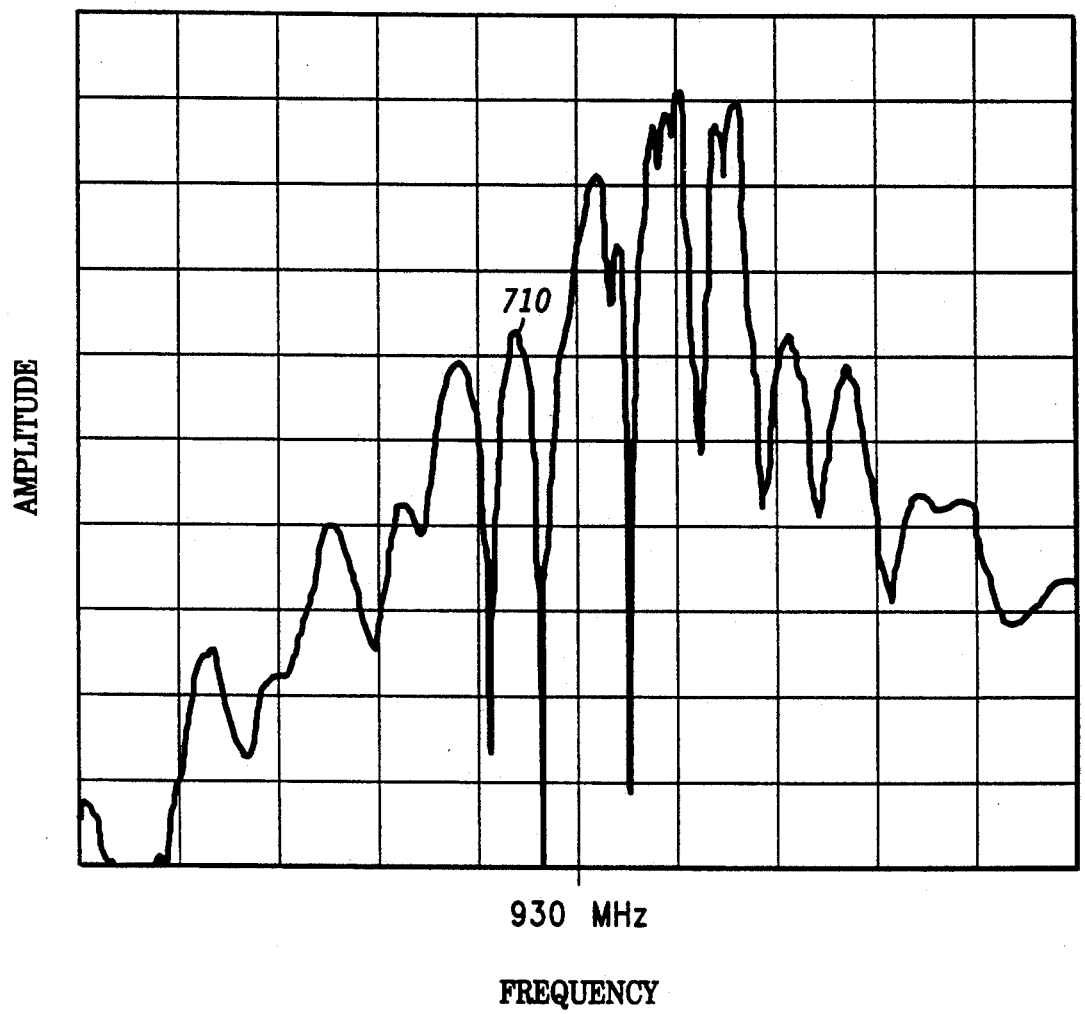
FIG. 7 illustrates a combined response from first through fourth acoustic transducers of the present invention.

FIG. 7 illustrates the combined response from first through fourth acoustic transducers of the present invention versus frequency, when they are combined such that the phase of the signal from the first and second filters is 180° removed from the ideal. Curve 710 illustrates a pass-band response having a minimum of 4 dB of insertion loss, a 3 dB bandwidth of about 10 MegaHertz, coupled with out-of-band signal rejection ranging from 15 to 30 dB, and shows substantially greater pass-band insertion loss than either of traces 510 and 610 of FIGS. 5 and 6, without any substantial change in bandwidth.

Figure 8:
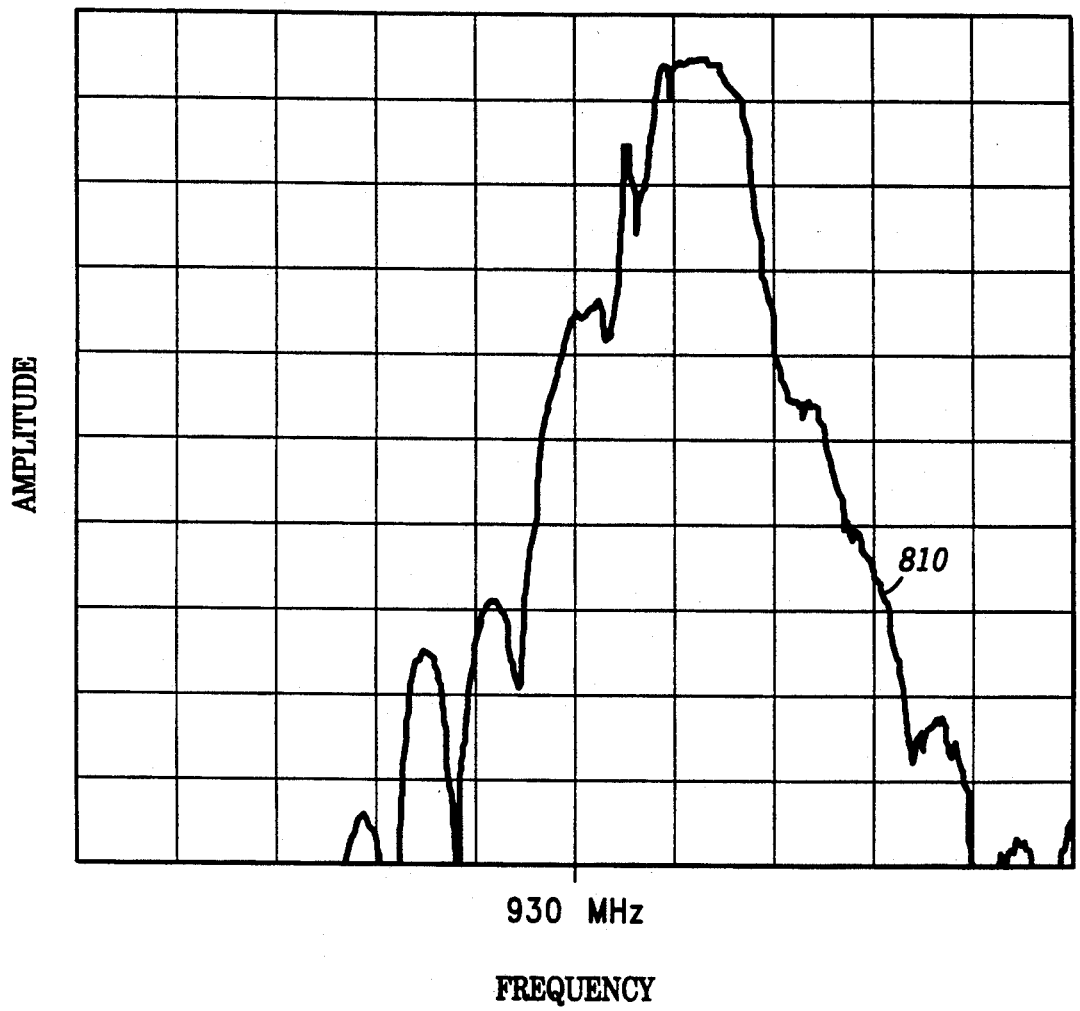
FIG. 8 illustrates a combined response from first through fourth acoustic transducers of the present invention when the transducers are connected in accordance with the present invention.

FIG. 8 illustrates the combined response from first through fourth acoustic transducers of the present invention when the transducers are connected in accordance with the present invention versus frequency. Trace 810 illustrates a pass-band insertion loss of 2.5 dB, a 3 dB bandwidth of 20 to 25 MegaHertz, improved pass-band ripple compared to the data of FIGS. 5–7, and out-of-band rejection ranging from 30 to more than 45 dB. Trace 810 thus comprises a measured response showing substantial improvement over the combination of characteristics previously shown in FIGS. 5–7.

The bandwidth of the data of FIG. 8 is roughly twice those illustrated in FIGS. 5–7. This is due to the differences in the gap widths and also to the relative phase of the signals applied to the inputs and combined from the outputs of the filters comprising the overall acoustic filter. The advantages of broader bandwidth and greater out-of-band signal rejection allow such filters to fulfill needs in a greater number of system applications since such filters provide a strong, nearly noise free output signal.

Figure 9:
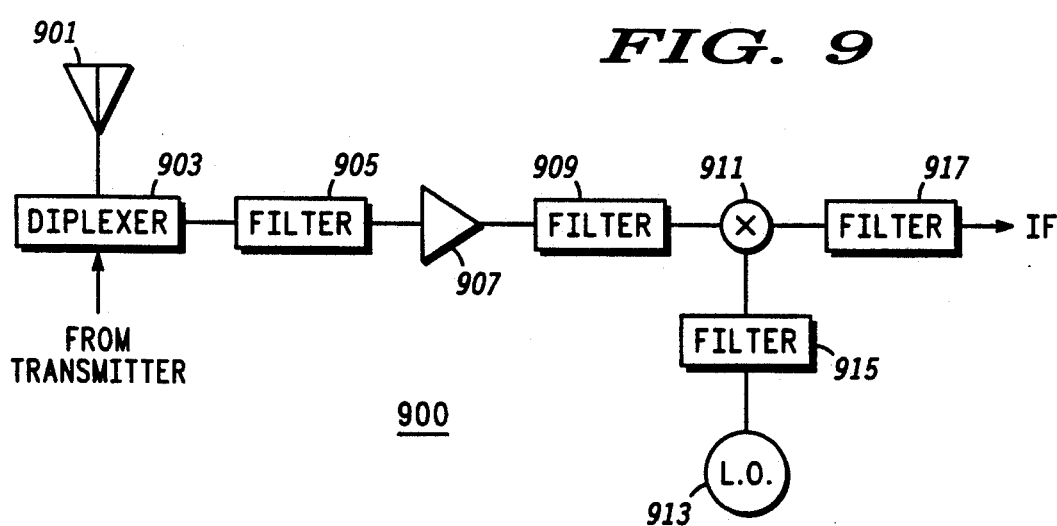
FIG. 9 is a block diagram of a radio receiver including surface acoustic wave filters in accordance with the present invention.

FIG. 9 is a block diagram of a portion of radio receiver 900 including surface acoustic wave filters in accordance with the present invention. FIG. 9 depicts a radio receiver utilizing a number of surface acoustic wave (SAW) filters in accordance with the present invention. Radio receiver 900 includes antenna 901 which is used to receive and transmit signals. Diplexer 903 is connected to antenna 901 and to the transmitter portion (not shown). Diplexer 903 transmits received signals to filter 905. Filter 905 may be a SAW filter according to the present invention. Filter 905 is connected to amplifier 907. The output of amplifier 907 is transmitted to SAW filter 909. Filter 909 transmits its output to mixer 911 where the output is combined with a signal from local oscillator 913 via SAW filter 915. The output of mixer 911 is then filtered by SAW 917 to provide the IF output.

A method for providing low insertion loss acoustic filters comprises the steps of (1) providing an acoustic wave propagating substrate, (2) coupling a plurality of acoustic wave filters to the acoustic wave propagating substrate, (3) supplying an input signal to the first and second acoustic wave filters and (4) combining the output signals from the first and second acoustic wave filters in parallel.

By now it should be appreciated that the invention discloses frequency selection components having the advantages of doubling the bandwidth together with small size and large out-of-band signal rejection.

As described herein, the present invention meets the goals and advantages set forth earlier, namely, providing means and methods for broad bandwidth acoustic wave filters having low pass-band insertion loss, low triple transit spurious response, strong rejection of out-of-band signals, and single level photolithographic process fabrication requirements. A further advantageous feature results from incorporation of only one or two distinct line-widths in the photolithographic fabrication of the acoustic wave filter.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A method for providing wide bandwidth, low band-pass insertion loss acoustic filters comprising the steps of:
   providing an acoustic wave propagating substrate;
   coupling a first acoustic wave filter having a first input, a first output, a first center frequency, low insertion loss and a first bandwidth to the acoustic wave propagating substrate;
   coupling a second acoustic wave filter having a second input, a second output, a second centre frequency, low insertion loss and a second bandwidth to the acoustic wave propagating substrate, said first and second acoustic wave filters each including corresponding electrodes having a common width and a common periodicity;
   connecting the first and second inputs directly together to provide a common input;
   supplying an input signal to the common input;
   providing by the first output, a first output signal;
   providing by the second output, a second output signal;
   connecting the first and second outputs directly together to provide a common output; and
   combining the first and second output signals by the common output to produce an output signal having a wide bandwidth, wherein said wide bandwidth is greater than either the first or second bandwidth.

2. A method as claimed in claim 1, wherein said step of comprising the first acoustic wave filter includes steps of:
   disposing a first acoustic wave reflector comprising a plurality of reflection elements on the acoustic ave propagating substrate; and
   disposing a first bi-directional acoustic wave transducers including the corresponding electrodes having the common width and the common periodicity on the acoustic wave propagating substrate adjacent to the first acoustic wave reflector and spaced therefrom by a first gap having a first width disposed between the first acoustic wave reflector and the first bi-directional acoustic wave transducer, the first gap, the first acoustic wave reflector and the first bi-directional acoustic wave transducer comprising a first unidirectional acoustic wave transducer.

3. A method as claimed in claim 2, wherein said step of coupling the first acoustic wave filter further includes steps of:
   disposing a second acoustic wave reflector comprising a plurality of reflection elements on the acoustic wave propagating substrate; and
   disposing a second bi-directional acoustic wave transducer including the corresponding electrodes having the common width and the common periodicity on the acoustic wave propagating substrate adjacent to the second acoustic wave reflector and spaced therefrom by a second gap having the first width disposed between the second acoustic wave reflector and the second bi-directional acoustic wave transducer, the second gap, the second acoustic wave reflector and the second bi-directional acoustic wave transducer comprising a second unidirectional acoustic wave transducer.

4. A method as claimed in claim 3, wherein said step of disposing a second bi-directional acoustic wave transducer includes a step of providing a conductive structure including the corresponding electrodes having the common width and the common periodicity disposed between the first and second unidirectional acoustic wave transducers, wherein said conductive structure comprises electrically interconnected elements.

5. A method as claimed in claim 1, wherein said step of coupling the second acoustic wave filter includes the steps of:
   disposing a third acoustic wave reflector comprising a plurality of reflection elements on the acoustic wave propagating substrate; and
   disposing a third bi-directional acoustic wave transducer including the corresponding electrodes having the common width and the common periodicity on the acoustic wave propagating substrate adjacent to the third acoustic wave reflector and spaced therefrom by a third gap having a second width disposed between the third acoustic wave reflector and the third bi-directional acoustic wave transducer, the third gap, the third acoustic wave reflector and the third bi-directional acoustic wave transducer comprising a third unidirectional acoustic wave transducer.

6. A method as claimed in claim 5, wherein said step of coupling the second acoustic wave filter further includes steps of:
   disposing a fourth acoustic wave reflector comprising a plurality of reflection elements on the acoustic wave propagating substrate; and
   disposing a fourth bi-directional acoustic wave transducer including the corresponding electrodes having the common width and the common periodicity on the acoustic wave propagating substrate adjacent to the fourth acoustic wave reflector and spaced therefrom by a fourth gap having the second width disposed between the fourth acoustic wave reflector and the fourth bi-directional acoustic wave transducer, and the fourth gap, the fourth acoustic wave reflector and the fourth bi-directional acoustic wave transducer comprising a fourth unidirectional acoustic wave transducer.

7. A method as claimed in claim 6, wherein said step of disposing a fourth bi-directional acoustic wave transducer includes a step of providing a conductive structure including the corresponding electrodes having the common width and the common periodicity disposed between the third and fourth unidirectional acoustic wave transducers, wherein said conductive structure comprises electrically interconnected elements.

8. A wide bandwidth acoustic wave filter comprising:
   a piezoelectric substrate comprising a piezoelectric material including a surface;
   a first acoustic wave filter, having a first center frequency, low loss and a first bandwidth, disposed on said surface of said piezoelectric substrate;
   a second acoustic wave filter, having a second center frequency, low loss and a second bandwidth, disposed on said surface of said piezoelectric substrate, said first and second acoustic wave filters including corresponding electrodes having a common width and a common periodicity;
   an input commonly connected to said first and second acoustic wave filters, said input receiving a first input signal and coupling said first input signal to said first and second acoustic wave filters;
   said first acoustic wave filter providing a first output signal in response to said first input signal;
   said second acoustic wave filter providing a second output signal in response to said first input signal; and
   an output commonly connected to said first and second acoustic wave filters, said output combining said first and second output signals from said first and second acoustic wave filters to provide a width bandwidth, low loss acoustic wave filter output, wherein said wide bandwidth is greater than either said first or said second bandwidth.

9. A filter as claimed in claim 8, wherein said first acoustic wave filter comprises:
   a first acoustic reflector comprising a plurality of reflection elements, said first acoustic reflector for reflecting acoustic waves;
   a first acoustic transducer for converting between electrical and acoustic energy, said first acoustic transducer including said corresponding electrodes having said common width and said common periodicity and adjacent to said first acoustic reflector; and
   a first gap having a first width disposed between said first acoustic reflector and said first acoustic transducer, said first acoustic reflector, said first acoustic transducer and said first gap comprising a first unidirectional acoustic transducer.

10. A filter as claimed in claim 9, wherein said first acoustic wave filter further comprises:
   a second acoustic reflector comprising a plurality of reflection elements, said second acoustic reflector for reflecting acoustic waves;
   a second acoustic transducer for converting between electrical and acoustic energy, said second acoustic transducer including said corresponding electrodes having said common width and said common periodicity and adjacent to said second acoustic reflector; and
   a second gap having said first width disposed between said second acoustic reflector and said second acoustic transducer, said second acoustic reflector, said second acoustic transducer and said second gap comprising a second unidirectional acoustic transducer, said first and second unidirectional acoustic transducers comprising said first acoustic wave filter.

11. A filter as claimed in claim 10, wherein said second acoustic wave filter comprises:
   a third acoustic reflector comprising a plurality of reflection elements, said third acoustic reflector for reflecting acoustic waves;
   a third acoustic transducer for converting between electrical and acoustic energy, said third acoustic transducer including said corresponding electrodes having said common width and said common periodicity and adjacent to said third acoustic reflector; and
   a third gap having a second width disposed between said third acoustic reflector and said third acoustic transducer, said third acoustic reflector, said third acoustic transducer and said third gap comprising a third unidirectional acoustic transducer.

12. A filter as claimed in claim 11, wherein said second acoustic wave filter further comprises:
   a fourth acoustic reflector comprising a plurality of reflection elements, said fourth acoustic reflector for reflecting acoustic waves;
   a fourth acoustic transducer for converting between electrical and acoustic energy, said fourth acoustic transducer including said corresponding electrodes having said common width and said common periodicity and adjacent to said fourth acoustic reflector; and
   a fourth gap having the second width disposed between said fourth acoustic reflector and said fourth acoustic transducer, said fourth acoustic reflector, said fourth acoustic transducer and said fourth gap comprising a fourth unidirectional acoustic transducer, said third and fourth unidirectional acoustic transducers comprising said second acoustic wave filter.

13. A filter as claimed in claim 12, wherein said first, second, third and fourth acoustic reflectors comprise pluralities of acoustic reflection elements each approximately one-fourth of a first acoustic wavelength of said first center frequency in width.

14. A filter as claimed in claim 12, wherein said first, second, third and fourth acoustic reflectors comprise pluralities of acoustic reflection elements each approximately one-half of a first acoustic wavelength of said first center frequency in width.

15. A filter as claimed in claim 12, wherein said first and second gap widths differ by one-fourth of a first acoustic wavelength of said first center frequency.

16. A wide bandwidth acoustic wave filtering apparatus including in combination:
   acoustic wave propagating substrate means for supporting propagation of acoustic waves;
   a plurality of acoustic wave filtering means for filtering an electrical input signal;
   an input commonly connected to each of said plurality of acoustic wave filtering means, said input receiving said electrical input signal and coupling said electrical input signal to each of said plurality of acoustic wave filtering means;
   each of said plurality of acoustic wave filtering means having a distinct center frequency and a distinct bandwidth, each of said plurality of acoustic wave filtering means including corresponding electrodes having a common width and a common periodicity, each of said plurality of acoustic wave filtering means comprising:
   input means for receiving said electrical input signal, said input means coupled to said input;
   input unidirectional acoustic wave transducer means for converting said electrical input signal into acoustic energy, said input unidirectional acoustic wave transducer means coupled to said input means; and output unidirectional acoustic wave transducer means for converting said acoustic energy to an output electrical signal, said output unidirectional acoustic wave transducer means acoustically coupled to said input unidirectional acoustic wave transducer means, wherein said input and output unidirectional acoustic wave transducer means comprise said corresponding electrodes having said common width and said common periodicity; and said wide band acoustic wave filter apparatus further including output means, said output means commonly connected to each of said output unidirectional acoustic wave transducer means, said output means for combining said electrical output signals from each of said plurality of acoustic wave filtering means and delivering a filtered electrical output signal having a broad bandwidth and low acoustic loss, wherein said broad bandwidth exceeds each of said distinct bandwidths.

17. The apparatus of claim 16, wherein, in any particular one of said plurality of filtering means, at least one of said input unidirectional acoustic wave transducer means further comprises:

first acoustic wave reflector means comprising a first plurality of reflection elements, said first acoustic wave reflector means for reflecting acoustic waves, said first acoustic wave reflector means coupled to said acoustic wave propagating substrate means;

first acoustic wave transducer means for converting said electrical input signal to said acoustic energy, said first acoustic wave transducer means coupled to said acoustic wave propagating substrate means, said first acoustic transducer means including said corresponding electrodes having said common width and said common periodicity and adjacent said first acoustic reflector means; and first gap means for separating said first acoustic wave reflector means from said first acoustic wave transducer means, said first acoustic wave transducer means, said first gap means and said first acoustic wave reflector means comprising said at least one input unidirectional acoustic wave transducer means.

18. An apparatus as claimed in claim 17, wherein, in a different one of said plurality of filtering means from said any particular one of said plurality of filtering means, at least another one of said input unidirectional acoustic wave transducer means further comprises:

second acoustic wave transducer means for converting said acoustic energy to said output electrical signal, said second acoustic wave transducer means including said corresponding electrodes having said common width and said common periodicity and coupled to said acoustic wave propagating substrate means;

second acoustic wave reflector means comprising a second plurality of reflection elements, said second acoustic wave reflector means for reflecting acoustic waves, said second acoustic wave reflector means coupled to said acoustic wave propagating substrate means, said second acoustic transducer means being adjacent said second acoustic reflector means; and second gap means for separating said second acoustic wave reflector means from said second acoustic wave transducer means, said second acoustic wave reflector means, said second gap means and said second acoustic wave transducer means comprising said at least another one input unidirectional acoustic wave transducer means.

19. An apparatus as claimed in claim 18, wherein:
said first plurality of reflection elements further comprise reflection elements having a width of approximately one-fourth of an acoustic wavelength of said distinct center frequency; and
said second plurality of reflection elements further comprise reflection elements having a width of approximately one-fourth of an acoustic wavelength of said distinct center frequency.

20. An apparatus as claimed in claim 18, wherein:
said first plurality of reflection elements further comprise reflection elements having a width of approximately one-half of an acoustic wavelength of said corresponding distinct center frequency; and
said second plurality of reflection elements further comprise reflection elements having a width of approximately one-half of an acoustic wavelength of said corresponding distinct center frequency.

21. In a radio frequency apparatus, at least one surface acoustic wave (SAW) filter for providing a frequency selection function, said SAW filter comprising:

acoustic wave propagating substrate means for supporting propagation of acoustic waves;

an input receiving an electrical input signal;

a plurality of acoustic wave filtering means each coupled to said input, each of said plurality of acoustic wave filtering means for filtering said electrical input signal, each of said plurality of acoustic wave filtering means having a distinct center frequency and a distinct bandwidth, each of said plurality of acoustic wave filtering means including corresponding electrodes of a common width and a common periodicity, each of said plurality of acoustic wave filtering means further comprising:

input means coupled to said input for receiving said electrical input signal;

input unidirectional acoustic wave transducer means for converting said electrical input signal coupled by said input means into acoustic energy, said input unidirectional acoustic wave transducer means coupled to said input means; and output unidirectional acoustic wave transducer means for converting said acoustic energy to an output electrical signal, said output unidirectional acoustic wave transducer means acoustically coupled to said input unidirectional acoustic wave transducer means, wherein said input and output unidirectional acoustic wave transducer means comprise said corresponding electrodes having said common width and said common periodicity; and said wide band acoustic wave filter apparatus further including output means, said output means commonly connected to said output unidirectional acoustic wave transducer means, said output means combining said electrical output signals from each of said plurality of acoustic waves filtering means and delivering a filtered electrical output signal having a broad bandwidth and low acoustic loss, wherein said broad bandwidth is greater than each of said distinct bandwidths.

22. In a radio frequency apparatus, at least one surface acoustic wave (SAW) filter for providing a frequency selection function, said SAW filter comprising:
   a piezoelectric substrate comprising a piezoelectric material including a surface;
   a first acoustic wave filter, having a first center frequency, low loss and a first bandwidth, disposed on said surface of said piezoelectric substrate;
   a second acoustic wave filter, having a second center frequency, low loss and a second bandwidth, disposed on said surface of said piezoelectric substrate, said first and second acoustic wave filters comprising corresponding electrodes having a common width and a common periodicity;
   an input directly connected to said first and second acoustic wave filters, said input receiving a first input signal and coupling said first input signal to said first and second acoustic wave filters;
   said first acoustic wave filter providing a first output signal in response to said first input signal;
   said second acoustic wave filter providing a second output signal in response to said first input signal; and
   an output directly connected to said first and second acoustic wave filters, said output combining said first and second output signals from said first and second acoustic wave filters and delivering a wide bandwidth, low-loss acoustic wave filter output, wherein said wide bandwidth exceeds either said first or said second bandwidth.

23. An acoustic filter having an input receiving electrical signals and an output providing electrical signals, said acoustic filter comprising:
   a first acoustic wave filter having a first center frequency, comprising a first transducer connected directly to said input and a second transducer connected directly to said output, said first transducer acoustically coupled to said second transducer, said first and second transducers each comprising a first acoustic reflector, a first gap having a first width and a first acoustic transducer, said first gap separating said first acoustic reflector from said first acoustic transducer; and
   a second acoustic wave filter having second center frequency, comprising a third transducer connected directly to said input and a fourth transducer connected directly to said output, said third transducer acoustically coupled to said fourth transducer, said third and fourth transducers each comprising a second acoustic reflector, a second gap having a second width and a second acoustic transducer, said second gap separating said second acoustic reflector from said second acoustic transducer, wherein said first and second gap widths differ by one-fourth of an acoustic wavelength of said first center frequency.

24. A filter as claimed in claim 23, wherein each of said first acoustic reflectors comprise pluralities of acoustic reflection elements each having a width which is approximately one-half of a first acoustic wavelength of said first center frequency in width.

25. A filter as claimed in claim 23, wherein each of said first and second acoustic wave filters are coupled to a substrate comprising lithium niobate.

26. A filter as claimed in claim 23, wherein each of said first and second acoustic wave filters are coupled to a substrate comprising one hundred twenty eight degree y-rotated, x-propagating lithium niobate.

27. A filter as claimed in claim 23, wherein said first acoustic reflectors comprise pluralities of acoustic reflection elements each having a width which is approximately one-fourth of a first acoustic wavelength of said first center frequency in width.

* * * * *